United States Patent [19]

Kaya et al.

[11] Patent Number: 5,596,528
[45] Date of Patent: *Jan. 21, 1997

[54] METHOD OF USING SOURCE BIAS TO RAISE THRESHOLD VOLTAGES AND/OR TO COMPACT THRESHOLD VOLTAGES

[75] Inventors: Cetin Kaya, Dallas; Wayland B. Holland, Garland; Rabah Mezenner, Richardson, all of Tex.

[73] Assignee: Texas Instruments Incorporated, Dallas, Tex.

[*] Notice: The term of this patent shall not extend beyond the expiration date of Pat. No. 5,467,306.

[21] Appl. No.: 532,313

[22] Filed: Sep. 22, 1995

Related U.S. Application Data

[63] Continuation of Ser. No. 85,427, Oct. 4, 1993, Pat. No. 5,467,306.
[51] Int. Cl.$^6$ .................................................. G11C 16/00
[52] U.S. Cl. .......................... 365/185.24; 365/185.02; 365/185.12; 365/185.18; 365/185.27; 365/185.3; 365/185.33
[58] Field of Search .................. 365/185.24, 185.02, 365/185.12, 185.18, 185.27, 185.3, 185.33

[56] References Cited

U.S. PATENT DOCUMENTS

| 5,218,571 | 6/1993 | Norris | 365/185.18 |
| 5,272,669 | 12/1993 | Samachisa et al. | 365/185.3 |
| 5,481,494 | 1/1996 | Tang et al. | 365/185.24 |

*Primary Examiner*—David C. Nelms
*Assistant Examiner*—Andrew Q. Tran
*Attorney, Agent, or Firm*—Theodore D. Lindgren; Leo N. Heiting; Richard L. Donaldson

[57] ABSTRACT

The method of this invention allows use of a smaller wordline voltage Vp1 during programming. In addition, the method results in a relatively narrow distribution of threshold voltages Vt when used to flash program an array of memory cells (10). The method of this invention increases compaction gate-current efficiency by reverse biasing the source (11)/substrate (23) junction of the cell being programmed. The reverse biasing is accomplished, for example, by applying a bias voltage to the source (11) or by placing a diode (27), a resistor (29) or other impedance in series with the source (11). The reverse biasing limits the source current (Is) of cell being programmed and of the entire array during flash-programming compaction.

5 Claims, 5 Drawing Sheets

METHOD OF USING SOURCE BIAS TO RAISE THRESHOLD VOLTAGES AND/OR TO COMPACT THRESHOLD VOLTAGES

This is a continuation of application Ser. No. 08/085,427 filed Oct. 4, 1993, now U.S. Pat. No. 5,467,306, issued Nov. 14, 1995.

BACKGROUND OF THE INVENTION

The present invention relates to a nonvolatile, integrated-circuit memory array such as an electrically-erasable, electrically-programmable read-only-memory (EEPROM) array. In particular, the invention relates to a method for programming floating-gate memory cells.

EEPROMs using hot-carrier-injection programming, as opposed to Fowler-Nordheim tunneling programming, are described in: (a) "A Single Transistor EEPROM cell and its implementation in a 512K CMOS EEPROM," S. Mukherjee et al., IEDM 1985 (p. 616–619) and in (b) "A 90 ns 100K Erase/Program Cycle Megabit Flash Memory," V. Kynett et al., ISSCC 1989 (p. 140–141). The topic of reference (a) is also discussed in U.S. Pat. No. 4,698,787.

Using prior-art, hot-carrier-injection methods for programming, a reference voltage equal to the substrate voltage (Vss, which is perhaps 0 V) is applied to the source of the cell to be programmed, a first positive voltage Vdd, perhaps 6 V to 8 V, is applied to the drain, and a second positive voltage Vp1, perhaps 12 V, is applied to the control gate. Under those conditions, the channel between source and drain is highly conductive, the drain diffusion junction is reverse-biased with respect to the substrate (channel) while the source diffusion junction is not reverse-biased. Electrons reaching the drain diffusion are subjected to two electric fields, one associated with the reverse-biased drain diffusion junction and the other associated with the positive voltage coupled from the control gate to the floating gate. The electric fields cause electrons (hot carriers) to be injected into the floating gate.

One of the problems arising in flash EEPROMs is over-erasure of cells. An over-erased cell has a positive charge, causing the channel under the floating gate to be conductive. That over-erased conductive cell short circuits other cells in its column of parallel-connected cells. One method to compensate for over-erasure is to form the flash EEPROMs with split gates. Another method is to program all of the EEPROM cells, then apply light erasing pulses in steps, checking after each step to see whether or not all of the cells are erased. Other methods include applying alternating programming and erasing steps as described, for example, in U.S. Pat. No. 5,132,935 issued Jul. 21, 1992, and in U.S. Pat. No. 5,122,985 issued Aug. 16, 1992 and the references therein. Both patents relate to compaction, or narrowing, of the threshold voltage distributions of flash erased cells and both patents are assigned to Texas Instruments Incorporated.

One problem associated with prior-art flash EEPROMs has been a wide distribution of threshold voltages after a flash erase operation. The wide distribution is believed to be caused in part by trapped holes in the gate insulator or by injection of hot holes into the floating gate.

It is desirable to have a narrow distribution of threshold voltages after performing a flash erase procedure. In order to obtain the narrow distribution of erased threshold voltages, flash erase methods may require, as discussed above, at least one flash programming step before the final erase step to arrive at a final narrow distribution of erased threshold voltages.

At least two methods have been proposed to narrow or "compact" the distribution of programmed threshold voltages. Both of those methods are generally capable of raising the threshold voltages of cells having low voltage threshold voltages. One of those methods uses wordline stress to cause Fowler-Nordheim injection of electrons into the floating gate. The advantage of that method is that it is not limited by the magnitude of bitline leakage current. However, that method requires gate voltages higher than the normal programming voltage. Those higher gate voltages require, in turn, special fabrication steps to either lower the electric fields in the dielectric elements or strengthen those dielectric elements.

A second proposed method relies on hot-electron injection into the gate. This method is described in "A Self-Convergence Erasing Scheme for a Simple Stacked Gate Flash EEPROM", Yamada, et al., IEDM 1991 (p. 11.4.1–11.1.4). In the second method, the bitlines are biased at a voltage of 6–7 V and the sources are grounded (substrate voltage, or 0 V) while a low voltage (0–2 V) is applied to the control gates. While the voltages required by this approach are well within the circuit capability, the disadvantage of this second method is its requirement for large channel currents. That is, if there are several depleted cells connected to a drain-column line, that drain-column line may be over-loaded, thereby reducing programming capability. If the drain-column-line leakage is too large, the drain-column voltage collapses, causing the compaction procedure to fail. Also, using this second method (with sources grounded), hot holes may be injected into the gate thus increasing the drain-column-line leakage and defeating the purpose of the compaction.

A method for programming EPROMs using channel-hot electrons with sources biased at a positive voltage with respect to the substrate is described in U.S. Pat. No. 5,218,571 issued Jun. 8, 1993. In the method described in that patent, the control gates are biased at voltages equal to or greater than the threshold voltages of the EPROM cells.

SUMMARY OF THE INVENTION

When used to flash program an array of memory cells, the efficient, tolerant compaction method of this invention results in a relatively narrow distribution of threshold voltages. The method eliminates the drain-column-line loading effect, which is a problem in prior-art programming methods that use grounded sources. In addition, the method of this invention overcomes the limitations of the "wordline stress approach" because the method does not require a high voltage for application to the wordlines. In fact, the method described herein requires voltages and currents that are well within the capabilities of known chip-manufacturing techniques, while at the same time decreasing the possibility of inadvertent programming of non-selected cells connected to the wordline.

The method of this invention increases compaction gate-current efficiency by reverse biasing the source-substrate junctions of the cell or cells being programmed. The reverse biasing is accomplished, for example, by applying a bias voltage to the source or by placing a resistor or other impedance between the source and the substrate (ground). The reverse biasing limits the channel currents of individual cells being programmed and of the entire array during a flash-programming compaction step.

Compared to prior-art compaction methods, the method results in a gate-current compaction over 100 times that of prior-art solutions. In addition, the method decreases the undesirable effect of hot-hole injection on the compaction process.

In addition, the method of this invention provides increased margin against array leakage.

If the floating gate of a cell loses charge, for any reason, during a previous compaction erasure step, that cell's voltage threshold is restored using this method.

DETAILED DESCRIPTION OF THE INVENTION

Figure 1:
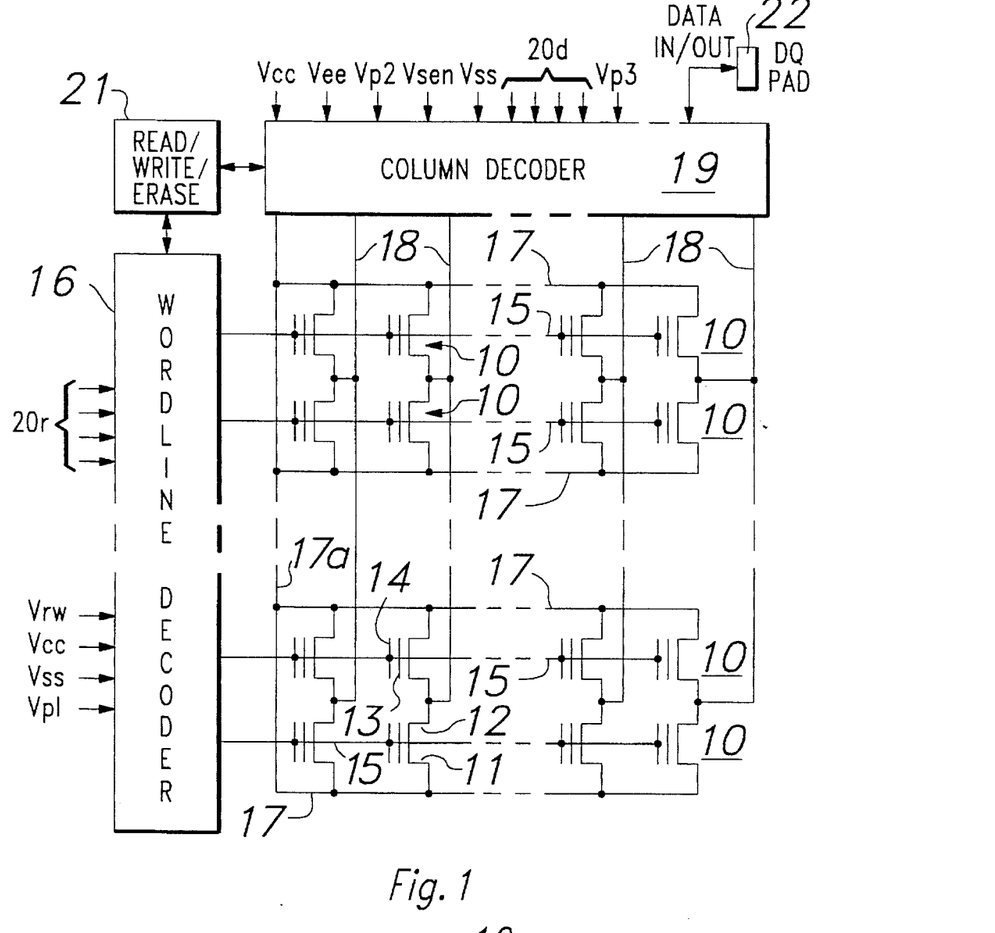
FIG. 1 is an electrical schematic diagram, in partial block form, of a memory cell array.

Referring to FIG. 1, an example array of memory cells, which is an integral part of a memory chip, is shown for the purpose of illustrating use of the method of this invention. Each cell is a floating-gate transistor 10 having a source 11, a drain 12, a floating gate 13, a control gate 14. Each of the control gates 14 in a row of cells 10 is connected to a wordline 15, and each of the wordlines 15 is connected to a wordline decoder 16. Each of the sources 11 in a row of cells 10 is connected to a source line 17. Each of the drains 12 in a column of cells 10 is connected to a drain-column line 18. Each of the source lines 17 is connected by a common-column line 17a to a column decoder 19 and each of the drain-column lines 18 is connected to the column decoder 19.

In the read mode, the wordline decoder 16 functions, in response to wordline address signals on lines 20r and to signals from microprocessor 21, to apply a preselected positive voltage Vcc (approx. +5 V) to the selected wordline 15, and to apply a low voltage (ground or Vss) to deselected wordlines 15. The column decoder 19 functions to apply a preselected positive voltage Vsen (approx. +1 V) to at least the selected drain-column line 18 and to apply a low voltage (0 V) to the source line 17. The column decoder 19 also functions, in response to signal on address lines 20d, to connect the selected drain-column line 18 of the selected cell 10 to the DATA IN/OUT terminal. The conductive or nonconductive state of the cell 10 connected to the selected drain-column line 18 and the selected wordline 15 is detected by a sense amplifier (not shown) connected to the DATA IN/OUT terminal 22.

During a flash-erase mode, the column decoder 19 may function to leave all drain-column lines 18 floating (connected to a high impedance such as field-effect transistor biased in "OFF" condition). The wordline decoder 16 functions to connect all the wordlines 15 to reference potential Vss, which may be ground. The column decoder 19 also functions to apply a high positive voltage Vee (approx. +10 V to +15 V) to all the source lines 17. These erasing voltages create sufficient field strength across the gate oxide region to generate a Fowler-Nordheim tunnel current that transfers charge from the floating gate 13, erasing the memory cell 10. Since the potential on the wordline 15 is 0 V, the cell 10 remains in the nonconducting state during erase. For that reason, and also by reason of the fact that the drain 12 is floated, no channel-hot carriers are generated.

In a prior-art write or program mode, the wordline decoder 16 may function, in response to wordline address signals on lines 20r and to signals from Read/Write/Erase control circuit 21, (or microprocessor 21) to place a preselected first programming voltage Vp1 (approx. +12 V) on a selected wordline 15, including a selected control-gate 14. Column decoder 19 also functions to place a second programming voltage Vp2 (approx. +5 to +10 V) on a selected drain-column line 18 and, therefore, the drain 12 of selected cell 10. In the prior-art method, source lines 17 are connected to reference potential Vss, which may be ground. All of the deselected drain-column lines 18 are connected to reference potential Vss or are floated. These programming voltages create a high current (drain 12 to source 11) condition in the channel of the selected memory cell 10, resulting in the generation near the drain-channel junction of channel-hot electrons and avalanche-breakdown electrons that are injected across the channel oxide to the floating gate 13 of the selected cell 10. The programming time is selected to be sufficiently long to program the floating gate 13 with a negative program charge of approximately −2 V to −6 V with respect to the channel region (with Vp1 at 0 V). For memory cells 10 fabricated in accordance with the example embodiment, the coupling coefficient between a control gate 14/wordline 15 and a floating gate 13 is approximately 0.6. Therefore, a prior-art programming voltage Vp1 of 12 V, for example, on a selected wordline 15, including the selected control gate 14, places a voltage of approximately +7.2 V on the selected floating gate 13. The voltage difference between the floating gate 13 (at approx. +7.2 V) and the grounded (approx. 0 V) source line 17 is insufficient to cause a Fowler-Nordheim tunneling current across the gate oxide between source 11 and floating gate 13 to charge the floating gate 13 of a selected or deselected cell 10. The floating gate 13 of the selected cell 10 is charged with hot electrons injected during programming, and the electrons in turn render the source-drain path under the floating gate 13 of the selected cell 10 nonconductive, a state which is read as a "zero" bit. Deselected cells 10 have source-drain paths under the floating gate 13 that remain conductive, and those cells 10 are read as "one" bits.

In the flash-program compaction mode (which may follow a prior-art flash erase cycle), according to this invention, the wordline decoder 16 may function, in response to wordline address signals on lines 20r and to signals from Read/Write/Erase control circuit 21, (or microprocessor 21) to place a preselected first programming voltage Vp1 (approx. +1 V to +4 V) on all of the wordlines 15. Column decoder 19 also functions to place a second programming voltage Vp2 (approx. +6 V to +7 V) on all of drain-column lines 18. All of source lines 17 are raised to a third programming voltage Vp3 (approx. +1 V to +2 V). These programming voltages create a relatively low current (drain 12 to source 11) condition in the channel of the selected memory cell 10, resulting in the generation channel-hot electrons and avalanche-breakdown electrons that are injected across the channel oxide to the floating gate 13 of the cells 10. The programming time is selected to be sufficiently long to remove any positive charge from all of the floating gates 13 and to compact the threshold voltage Vt distribution. The length of time is on the order of one second, which is much longer than that of the prior-art method because of the very small charging currents. However, during that time, the whole array is programmed. The small programming voltage Vp1 does not, of course, cause a sufficient Fowler-Nordheim tunneling current across the gate oxide between source 11 and floating gate 13 to charge the floating gates 13 of cells 10. However, the floating gates 13 of cells 10 are charged slowly with hot electrons injected during programming.

The flash-program method of this invention is used to program all of the cells 10 prior to erase, or to program one cell or a row or column of cells, is similar to the compaction method described above except that the gate voltages of the programmed cells are ramped to a first programming voltage Vp1 of perhaps +10 V rather than the approximately +1 V to +4 V described above. Rather than simply removing any positive charge and/or compacting the voltage thresholds Vt, the floating gates are programmed with a negative program charge of approximately −2 V to −6 V with respect to the channel region. Again, the length of time required is much longer than that of the prior-art method because of the very small charging currents. However, overall chip programming times are comparable.

For convenience, a table of read, write and erase voltages is given in TABLE I below:

TABLE I

|  | Read | Write | Flash Erase | Flash Program | Flash Program (Compaction) |
|---|---|---|---|---|---|
| Selected Wordline | 5 V | 12 V | 0 V (All) | 10 V (All) (ramped) | 1–4 V (All) |
| Deselected Wordlines | 0 V | 0 V | — | — | — |
| Selected Drain Line | 1.0 V | 5–10 V | Float (All) | 5–10 V (All) | 6–7 V (All) |
| Deselected Drain Lines | 0 V/Float | 0 V/Float | — | — | — |
| Source Lines | 0 V | 0 V | 10–15 V (All) | 1–2 V (All) | 1–2 V (All) |

Figure 2:
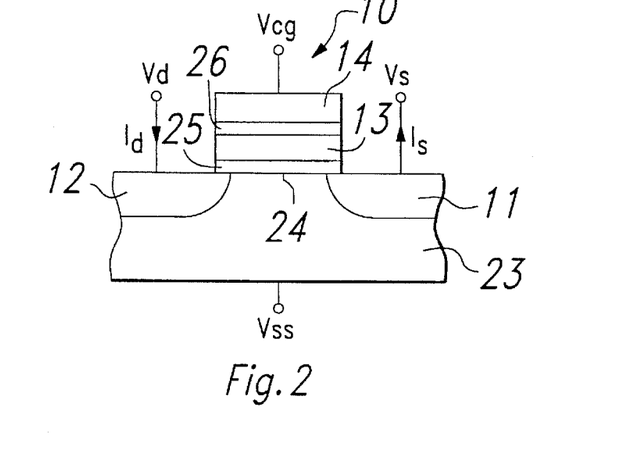
FIG. 2 is a cross-section of a typical floating-gate cell of the type used in the memory cell array of FIG. 1.

FIG. 2 is a cross-section of a typical floating-gate cell 10 of the type used in the memory cell array of FIG. 1. Source 11 and drain 12 are formed by impurity diffusion in a semiconductor substrate 23 having impurity of the opposite-type as the source 11 and drain 12 diffusions. The source 11 is typically formed by a diffusion of two types of impurities. The substrate 23 area between the source 11 and the drain 12 is the cell channel 24. The floating gate 13 is formed from a layer of polysilicon insulated from the channel 24 by gate insulator 25. The polysilicon control gate 14, which is a part of the wordline 15 of FIG. 1, is insulated from the floating gate 13 by and interlevel insulator 26.

This invention may best be explained by reference to data obtained from experiments on test structures of several thousand incomplete memory cells 10. One type of test structure is similar to an actual array of cells 10 except that process for fabricating floating gate memory cells 10 was stopped at a point after the polysilicon floating gate 13 layer was formed and before the polysilicon control gate 14 layer was to be formed. The source 11 and drain 12 diffusions are formed using the same procedure as that used in forming an array of complete cells 10. The incomplete memory cells 10 of the test structure include extended polysilicon electrodes for the equivalent floating gates 13, allowing probe access to the floating-gate 13 polysilicon. The probe access to the floating-gate 13 polysilicon is used to measure the injection current Ig flowing to the equivalent floating gates 13 during programming.

A second type of test structure has cells 10 with actual floating gates 13 and with control gates 14 insulated by inter-level insulator 26 from those floating gates 13. Programming is accomplished by applying voltages to probes connected to the control-gate 14 polysilicon, to the source 11 conductors, and to the drain 12 conductors.

Figure 3:
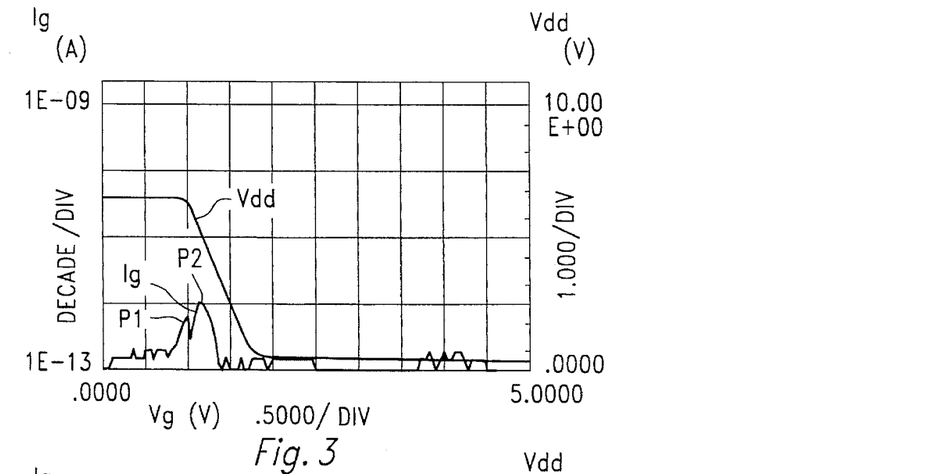
FIG. 3 illustrates a prior-art variation of gate current as the gate voltage of a multi-cell test structure varies, with +6.5 V connected to the drain through a 400 Ohm resistor and with the source grounded.
Figure 4:
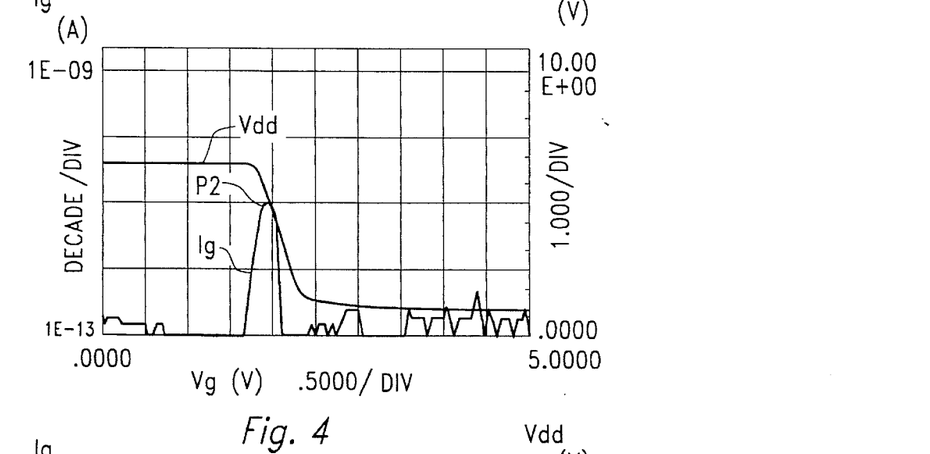
FIG. 4 illustrates variation of gate current and gate voltage as in FIG. 3, but with the source at +0.5 V.
Figure 5:
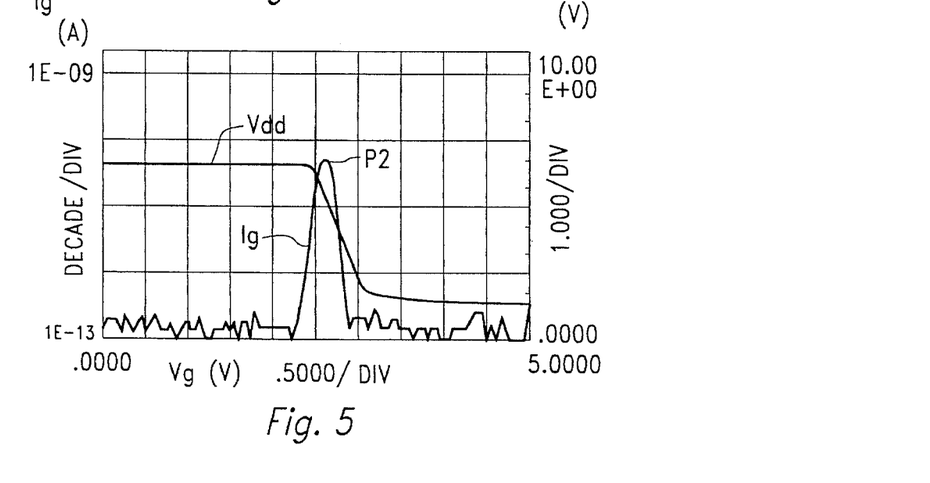
FIG. 5 illustrates variation of gate current and gate voltage as in FIG. 3, but with the source at +1.0 V.
Figure 6:
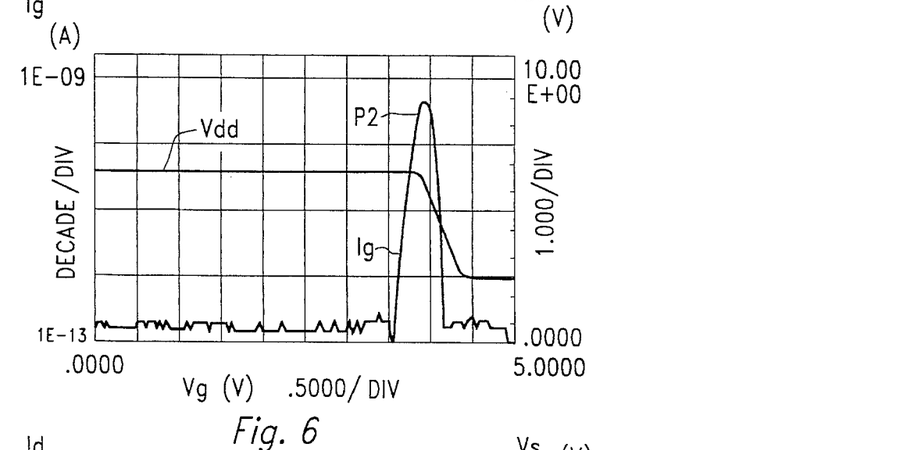
FIG. 6 illustrates variation of gate current and gate voltage as in FIG. 3, but with the source at +2.0 V.

FIGS. 3–6 illustrate the impact of source bias on the gate current Ig. The data for FIGS. 3–6 are taken with the drain of a first type of test structure tied to +6.5 V with respect to the substrate 23 through a 400-Ohm resistor. The floating gate voltage Vg is ramped from 0 V to +5 V with the source bias as a parameter while the absolute value of the gate current Ig is monitored. Vdd is the voltage at the drain 12 of the device 10. FIG. 3 illustrates the prior-art value with the source grounded to the substrate 23. The smaller peak P1 on the left corresponds to the absolute value of hole injection current, the actual current being negative. This peak P1 represents an unwanted current component because that component defeats the purpose of compaction by lowering further the threshold Vt of cells 10. The peak P2 of FIG. 3 represents desirable electron current. As shown in FIGS. 4–6, reverse-biasing the source-substrate junction enhances the gate current Ig significantly (over 100 times). The gate current exhibits only one peak P2. This peak P2 corresponds to electron current (the desired component of current), and the hole current, if any, is insignificant in comparison. Due to the body effect, raising the source bias voltage raises the gate bias at which the peak electron injection current occurs. Practically, this is of no concern since all of the voltages used are within the range of biases available at the chip level. It is noted that, using the method of this invention, the gate current Ig is enhanced (efficiency is increased) without increasing the channel current Id, and hence the power consumption.

Figure 7:
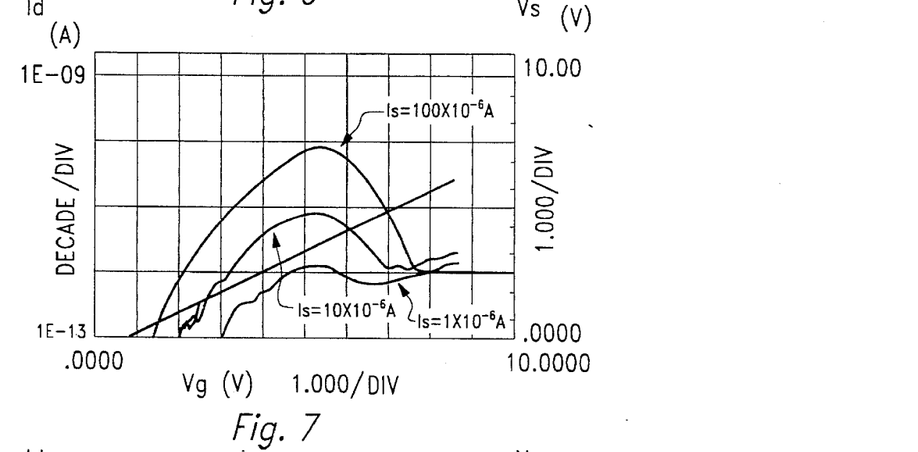
FIG. 7 illustrates variation in total equivalent floating-gate current in a multi-cell test structure for three values of current applied to a common source electrode, with +6.8 V applied to the drains and with varying equivalent floating-gate voltage.

FIG. 7 illustrates variation in total equivalent floating-gate current Ig for a first type of test structure having about 10,000 cells. Fixed currents Is of 1 microampere, 10 microamperes and 100 microamperes are applied to the common source 11 electrode with the substrate 23 at 0 V and with the drains 12 at about +6.8 V. The gate voltage Vg varies from 0 V to about +8.5 V for each of the fixed source currents Is and the equivalent floating-gate-electrode current Ig is measured for each fixed source current Is. Of course, use of these smaller values of injection current requires that the bias conditions be applied for a longer time to program the floating gate of a nonvolatile memory cell. The source voltage Vs is also shown in FIG. 7 as Vg varies and is practically the same for all of the values of Is. These data illustrate that gate current Ig scales with channel current Id.

Figure 8:
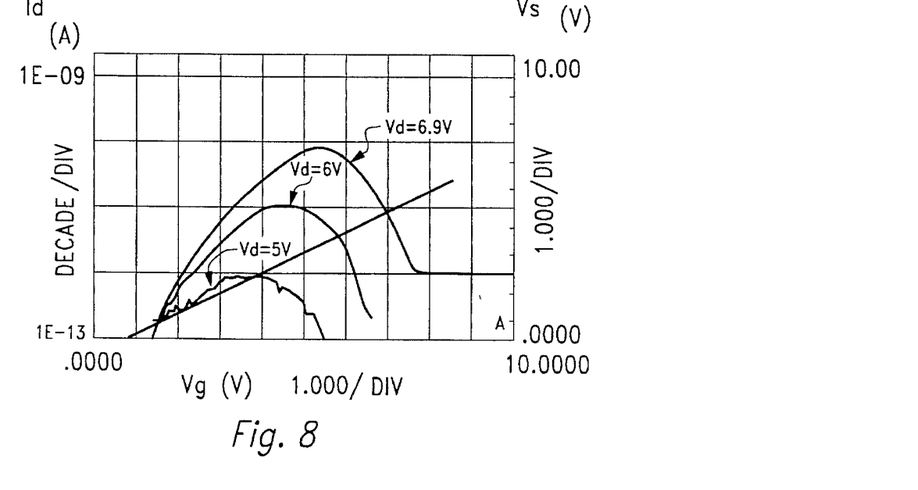
FIG. 8 illustrates variation in total equivalent floating gate current in a multi-cell test structure for three values of drain voltage, with a 100-microampere current applied to the common source electrode and with varying equivalent floating-gate voltage.

FIG. 8 also illustrates variation in total equivalent floating-gate current Ig, with drain bias Vd as a parameter, for a first type of test structure having about 10,000 cells. This time a current Is of 100 microamperes is applied to the common source 11 electrode with substrate 23 at 0 V. The drain 12 voltages are fixed at 5 V, 6 V and 6.9 V. The gate voltage Vg varies from 0 V to about 8.5 V with each of the fixed drain voltages Vd and the equivalent floating-gate-electrode current Ig is measured for each fixed drain voltage Vd.

Figure 9:
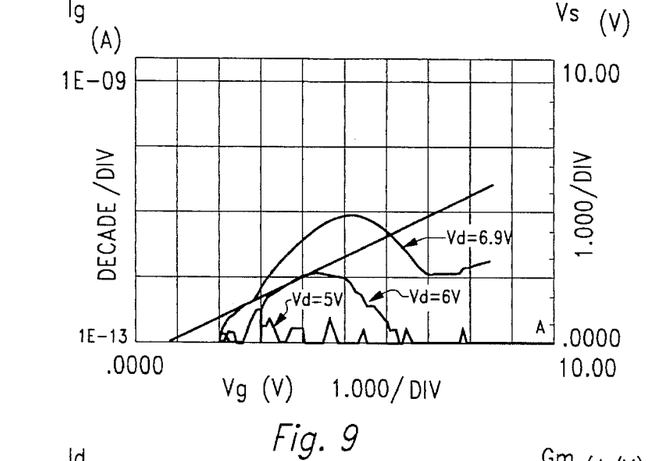
FIG. 9 illustrates variation in total equivalent floating gate current in a multi-cell test structure for three values of drain voltage, with a 10-microampere current applied to the common source electrode and with varying equivalent floating-gate voltage.

FIG. 9 again illustrates variation in total equivalent floating-gate current Ig for a first type of test structure having about 10,000 cells. This time a current Is of 10 microamperes is applied to the common source 11 electrode with substrate 23 at 0 V. The drain voltages Vd are fixed at 5 V, 6 V and 6.9 V. The gate voltage Vg varies from 0 V to about 8.5 V with each of the fixed drain voltages Vd and the equivalent floating-gate-electrode current Ig is measured for each fixed drain voltage Vd.

Figure 10:
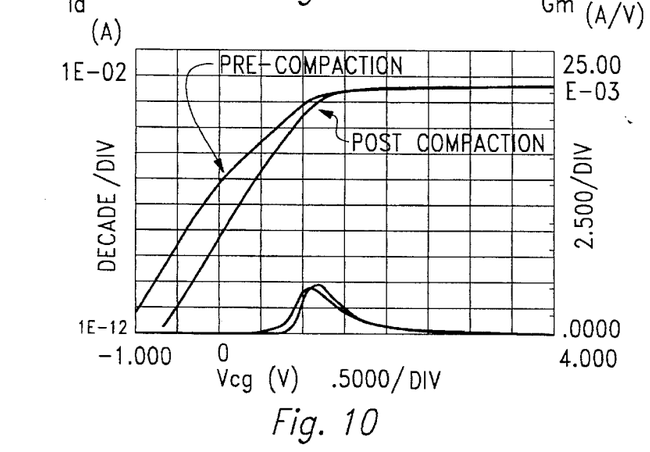
FIG. 10 compares a measure of the compaction of threshold voltages for a moderately-over-erased, multi-cell test structure before and after application of a 30-microampere current to the common source electrode for one second with the control-gate voltage at +5 V and with the drain voltage +6.5 V.

FIG. 10 illustrates the improvement in compaction of threshold voltages Vt in a second type of test structure having about 10,000 cells after application of a 30 microamperes of current to the common source 11 electrode for one second with the control-gate voltage Vcg at +5 V and with the drain voltage Vd at +6.5 V. The improvement in compaction is characterized by graphs of drain current Id variation as the control-gate voltage Vcg varies from −1 V to +4 V before and after the compaction procedure. The pre-compaction ramp has a smaller slope than the post-compaction ramp at one point and, also, is not a straight line, indicating that some cells 10 begin conducting before others as the control-gate voltage Vcg is increased. The leakage current, measured with control-gate voltage Vcg at 0 V, prior to compaction is approximately 1 microampere. (Leakage current is a measure of the number over-erased cells and the extent of that over-erasure.) The post-compaction ramp is a rather steep, straight line, indicating that the cells 10 begin conduction at the same point as the control-gate voltage Vcg is increased and, therefore, indicating a compact distribution of threshold voltages Vt. The leakage current after compaction is reduced by a factor greater than 100 to less than 0.01 microampere. The graph of transconductance Gm indicates change in drain current Id divided by change in control-gate voltage Vcg. The control-gate voltage Vcg at the peak of the Gm curve corresponds to the threshold voltage Vt of a typical cell 10.

Figure 11:
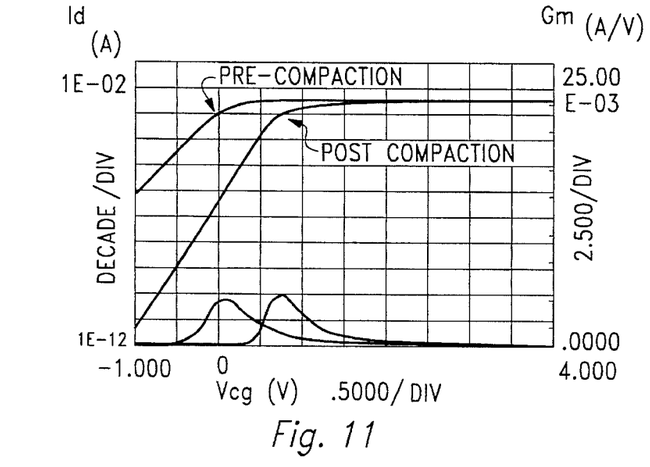
FIG. 11 compares a measure of the compaction of threshold voltages in a extremely-over-erased, multi-cell test structure before and after application of a 30-microampere current to the common source electrode for one second with the control-gate voltage 5 V and with the drain voltage at +6.5 V.

FIG. 11 also illustrates the improvement in compaction of threshold voltages Vt in a second type of test structure having about 10,000 cells after the same FIG. 10 application of a 30 microampere current Is to the common source 11 electrode for one second with the control-gate voltage Vcg at 5 V and with the drain voltage Vd at 6.5 V. This test structure has great deal more leakage current (1 milliampere) prior to compaction than that of the structure of FIG. 10. As in FIG. 10, the improvement is characterized by graphs of drain current Id variation as the control-gate voltage Vcg varies from −1 V to +4 V before and after compaction. The leakage current after compaction is less than 1 microampere, an over 1000 factor of improvement over the pre-compaction leakage current.

The experimental flash-program-compaction step on a particular OK test structure array requires one second and uses about 30 microamperes total source 11 current (FIGS. 10–11).

The methods presented above relied on the presence of channel current between source 11 and drain 12 junctions during operation. Although it is not as efficient in a sense as the methods described in the previous paragraphs, it is also possible to use the method without having an externally induced channel current between source 11 and drain 12. The advantage of no externally induced channel current is total insensitivity to the number of depleted bitlines in an over-erased memory array.

Figure 12:
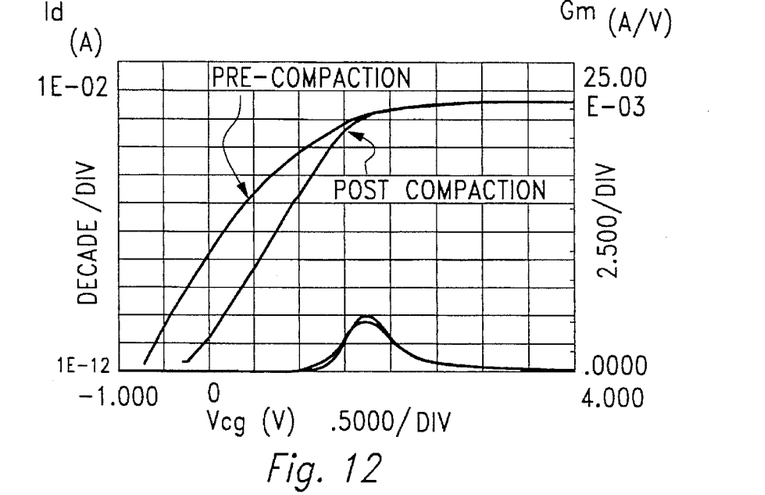
FIG. 12 compares a measure of the compaction of threshold voltages in a multi-cell test structure before and after application of a 100-microampere current to the drains for one second, with the common source electrode floating and with the control-gate voltage at +5 V.

FIG. 12 also illustrates the improvement in compaction of threshold voltages Vt in a second type of test structure having about 10,000 cells after injection of 100 microamperes of drain current Id into a common drain connection for one second with the common source 11 electrode floating (connected to a high impedance such as a field-effect transistor in an "OFF" state) and with the control-gate voltage at +5 V. The improvement is characterized by graphs of drain current Id as the control-gate voltage Vcg varies from −1 V to +4 V before and after compaction. As in FIG. 10, the pre-compaction ramp has a smaller slope than the post-compaction ramp at one point and, also, is not a straight line, indicating that some cells 10 begin conducting before others as the control-gate voltage Vcg is increased. The post-compaction ramp is a rather steep, straight line, indicating that the cells 10 begin conduction at the same point as the control-gate voltage Vcg is increased and, therefore, indicating a compact distribution of threshold voltages Vt.

Figure 13:
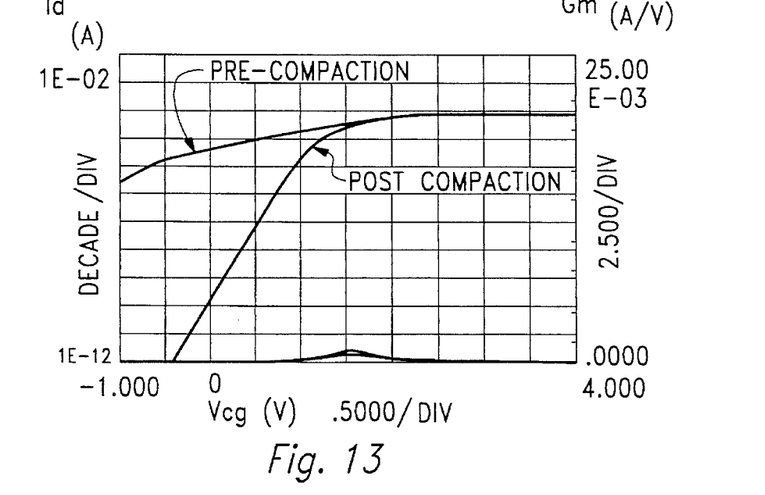
FIG. 13 compares a measure of the compaction of threshold voltages in a multi-cell test structure before and after application of a 10-microampere current to the drains for ten seconds, with the common source electrode floating and with the control gate voltage at +5 V.

FIG. 13 also illustrates the improvement in compaction of threshold voltages Vt in a second type of test structure having about 10,000 cells after injection of 10 microamperes of drain current Id into the common drain 12 electrode for ten seconds with the common source 11 electrode floating (connected to a high impedance) and with the control-gate voltage Vcg at +5 V. The improvement is characterized by graphs of drain current Id as the control-gate voltage Vcg varies from −1 V to +4 V before and after compaction. As in FIG. 11, the post-compaction ramp is steeper than the pre-compaction ramp, indicating a narrower range, or compacted distribution, of threshold voltages Vt.

Compared to the Fowler-Nordheim case, gate current Ig of FIGS. 12 and 13 starts at lower control-gate voltages Vcg. Hence, the need for high wordline 15 voltages is eliminated. And because the source 11 is left floating, this technique is not limited by the amount of source-drain leakage, the number of depleted cells 10, or the degree of depletion in those cells 10.

Because of increased injection efficiency using a positive-voltage bias applied to the source 11, a one-megabit flash memory array, for example, is flash programmable using the compaction procedure of this invention in one second or less while consuming a total current of about 10 mA total source 11 current.

Figure 14:
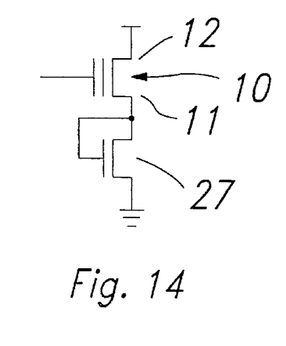
FIG. 14 illustrates a biasing circuit for use during the programming compaction operation.
Figure 15:
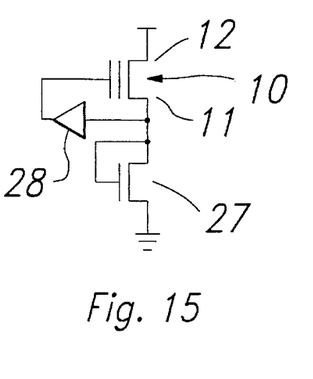
FIG. 15 illustrates a feedback circuit to control the gate voltage during the programming compaction operation.
Figure 16:
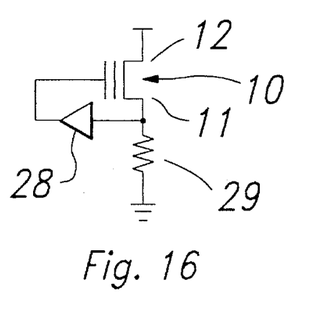
FIG. 16 illustrates a second feedback circuit to control the gate voltage during the programming compaction operation.

Source biasing methods used for programming compaction are described in FIGS. 14–16. FIG. 14 illustrates a diode-connected field-effect transistor 27 used m bias (+0.7 V, for example) the source 11 of an example cell 10 during programming. (Two diodes 27 in series are used to achieve a bias of +1.4 V.) The diode 27 connection may include a switching transistor (not shown) to permit the transistor 27 to be used for other purposes during other operations. As discussed previously, a voltage supply, a current supply, or a resistor, or combination thereof, may be used instead of the diode-connected field-effect transistor 27 for biasing. FIG. 15 illustrates use of an amplifier feedback circuit 28 in conjunction with the diode-connected field-effect transistor of FIG. 14 for controlling the control-gate voltage during the programming compaction operation. FIG. 16 illustrates a second amplifier feedback circuit for controlling the control-gate voltage during the programming compaction operation, but with the diode-connected field-effect transistor 27 of FIG. 14 replaced by a resistor 29. A prior-art amplifier feedback circuit used in conjunction floating-gate memory cells is described in U.S. Pat. No. 4,797,856. Another alternative is to adjust the gate bias to bring the source 11 voltage of the device to the optimum range (about +1 V to +2 V) for gate current injection. Another option is to limit the source 11 current while ramping the gate voltage.

The circuits of FIGS. 15–16 cause high gate bias voltage Vg at the beginning of a flash-programming-compaction step, which speeds the process. As the flash-programming compaction step proceeds, the gate bias voltage Vg decreases, slowing the programming current and converging, or compacting, the threshold voltages of the cells 10.

Another approach is application of a predetermined bias voltage to the gate 14, then application of a pulsed current to the source 11. The state of the array is then checked. The compaction process is stopped when the leakage current reaches a point below a predetermined value.

The physical origin of the gate current Ig of this invention may result from one or more of the following factors:

1) Electrons that are emitted externally from the source 11 junction and that gain energy in the drain 12 depletion region, becoming sufficiently energized to be emitted over the gate insulation barrier;

2) Electrons generated in the silicon substrate 23 due to impact ionization in the drain 12 depletion region (impact ionization may be initiated by an avalanche junction or by the band-to-band tunneling-induced hole current traversing through the high electric fields in the depletion region);

Some of the electrons of (2) above are collected by the depletion region under the gate 13. A fraction of those electrons gain energy across the depletion region (in a path perpendicular to the gate 13), followed by subsequent injection into the gate 13. In the case of a floating source 11, some of the electrons of (2) above are created by an impact ionization process, and those electrons are collected by the floating source 11. Due to the floating nature of the source 11 conductors, these electrons will be attracted back into the drain 12 junction along the silicon surface. A fraction of those electrons are emitted into the floating gate 13 following a mechanism similar mechanism to that described in (1). The difference is that in case (1) the electrons coming from the source 11 side are supplied externally, while in the latter case, the electrons are supplied by ongoing carrier multiplication process in the silicon substrate 23.

While the examples above have discussed only one type of floating-gate cell 10, this invention is useful in nonvolatile memories using any type of non-split-gate nonvolatile memory cell 10.

While the experimental data herein relates to voltages on equivalent floating gates 13 of a test structure, those voltages may converted to an approximate range of values required on a control gate 14 to result in a desired floating gate 13 voltage. The voltage Vg between the floating gate 13 and a reference voltage (Vss) is given by the equation $$Vg=(CppVcg+CsVs+CdVd+CchVch+Qf)/(Cpp+Cs+Cd+Cch)$$

where Cpp is the capacitance between the control gate 14 and the floating gate 13, Cs is the capacitance between the floating gate 13 and the source 11, Cd is the capacitance between the floating gate 13 and the drain 12, Cch is the capacitance between the floating gate 13 and the channel between source 11 and drain 12, Vcg is the voltage on the control gate 14, Vs is the voltage on the source 11, Vd is the voltage on the drain 12, Vch is the voltage on the channel between source 11 and drain 12, and Qf is the charge on the floating gate 13.

The experimental data herein describes certain bias conditions for drains 12 and other bias conditions for sources 11. In many cases, the general bias conditions for sources 11 and drains 12 are reversible, yet accomplish the same result. Therefore, the terms "source" and "drain" as used herein are interchangeable as used in this text, including the claims.

Thus to compact an array of cells, the drains 12 are held at, for example, +6 V to +8 V with respect to the substrate 23 voltage; the sources 11 are held at, for example, +1 V to +2 V; and the control gate 14 is held at approximately +1 V to +2 V higher than the source 11 voltage.

Using a second compaction procedure, the drains 12 are held at, for example, +6 V to +7 V with respect to substrate 23 voltage; the sources 11 are connected to a high impedance (floated); and the control gates 14 are held at, for example, +2 V to +5 V. The control gate 14 is held at a constant voltage, or is clocked between two values (+2 V and +5 V, for example), or the voltage on the control gate 14 is ramped slowly.

In both procedures, the voltage on the control gates has a value less than the typical threshold voltages of the cells with the positive voltage (reverse-biased voltage) on the sources. The word "typical" excludes those cells that are depleted, or over-erased. It is, of course, understood that the threshold voltage of a cell increases as the reverse-bias voltage on the source increases.

While this invention has been described with respect to an illustrative embodiment, this description is not intended to be construed in a limiting sense. Upon reference to this description, various modifications of the illustrative embodiment, as well as other embodiments of the invention, will be apparent to persons skilled in the art. It is contemplated that the appended claims will cover any such modifications or embodiments that fall within the scope of the invention.

We claim:

1. A method for increasing the thresttold voltage of at least one of a plurality of floating-gate memory cells in a non-volatile integrated-circuit memory having a substrate connected to a reference voltage, each said memory cell being of the single-transistor, non-slit-gate type, said method comprising:

connecting the sources of said plurality of memory cells to a high impedance;

causing currents to flow into the drains of said plurality memory cells; and placing a voltage on the control gates of said plurality of memory cells, said voltage being positive with respect to said reference voltage.

2. The method of claim 1, wherein a field-effect transistor in an "OFF" state is used to attain said high impedance.

3. The method of claim 1, wherein said plurality of memory cells is 10,000 of said memory cells, wherein a current of 100 microamperes is caused to flow into the parallel-connected drains of said plurality of memory cells and wherein said voltage on the control gates of said plurality memory cells is +5 volts with respect to said reference voltage, both for a period of one second.

4. The method of claim 1, wherein said plurality of memory cells is a column of memory cells.

5. The method of claim 1, said memory further having a ground voltage, wherein said reference voltage is said ground voltage.

* * * * *